United States Patent
Lu et al.

(10) Patent No.: US 6,626,280 B2
(45) Date of Patent: Sep. 30, 2003

(54) TRAY-POSITIONING DEVICE

(75) Inventors: Weng-Jung Lu, Hsinchu (TW); Chin-Yuan Liu, Hsinchu (TW); Shyan-Haur Jane, Hsinchu (TW); Chun-Kuei Lai, Hsinchu (TW); Chao-Hsien Huang, PanChiao (TW); Chih-Min Lin, MiaoLi (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 09/867,411

(22) Filed: May 31, 2001

(65) Prior Publication Data

US 2002/0179408 A1 Dec. 5, 2002

(51) Int. Cl.$^7$ ................................................ B65G 47/00
(52) U.S. Cl. ................................. 198/345.1; 198/345.3
(58) Field of Search ......................... 198/345.1, 345.3; 414/222.04, 222.06, 416

(56) References Cited

U.S. PATENT DOCUMENTS

| | | | | |
|---|---|---|---|---|
| 3,638,564 A | * | 2/1972 | Prange et al. | 198/345.1 |
| 4,255,077 A | * | 3/1981 | Smith | 198/345.3 |
| 4,302,919 A | * | 12/1981 | Hartness | 198/345.3 |
| 4,898,268 A | * | 2/1990 | Kamioka et al. | 198/345.1 |
| 5,829,571 A | * | 11/1998 | Mizuta et al. | 198/345.1 |

* cited by examiner

Primary Examiner—Joseph E. Valenza
(74) Attorney, Agent, or Firm—Troxell Law Office PLLC

(57) ABSTRACT

A tray-positioning device comprises a driving unit and a positioning unit, wherein the positioning unit provides a plurality of sidewalls that correspond to a plurality of upper sidewalls of a tray. By allowing the driving unit to move the positioning unit toward the tray or vice versa that said individual upper sidewalls are in close contact with the corresponding sidewalls, the tray-positioning device is capable of providing precise positioning for the tray.

3 Claims, 10 Drawing Sheets

TRAY-POSITIONING DEVICE

FIELD OF THE INVENTION

The present invention relates to a tray-positioning device and in particular relates to a tray-positioning device that utilizes the upper sidewalls of a tray for positioning. Having no mold lines or deformations commonly found on the lower sidewalls of a tray, the upper sidewalls possess smoother surfaces. Hence the tray-positioning device in the present invention is capable of providing higher degree of precision for tray positioning.

BACKGROUND OF THE INVENTION

Having undergone hundreds of processing steps, a semiconductor wafer is divided into a plurality of dies before being tested and packaged for delivery. To facilitate handling and management, dies are contained and carried around in a designated tray.

FIG. 1 shows a perspective view of a tray 1 for containing dies 2. Being square-slab shaped, said tray 1 possesses a total of four stair-contoured sides, each having a lower sidewall 12 and an upper sidewall 14 such that the upper sidewall 14 is situated on the inner side and above the lower sidewall 12. Said tray 1 provides a number of slots 16, each capable of containing a die 2. The step for transferring die 2 to slot 16 is loading.

In order to raise loading speeding and avoid human contact, most semiconductor plant uses robot arm for loading. If tray positioning is not accurate, the robot arm could not place individual dies on individual slots precisely as programmed.

To point out the importance of tray positioning, the loading process in die sorter is illustrated in the following. FIG. 2 shows a perspective view of a prior art die sorter 3, which comprises a die tray 32, a conveyor 34, a push unit 36 and a robot arm 38. Said die tray 32 is designated to hold a number of dies 2, being divided from semiconductor wafers, for loading. Said conveyor 34 provides an input terminal 341, an output terminal 342 and a sorter position 343. By placing an empty tray 1 on conveyor 34 at terminal 341 and having it carried to the sorter position 343 for loading, followed by sending out an full stray 1 at output terminal 342 after said empty tray 1 is filled with dies. Said conveyor 34 can deliver one or a plurality of trays 1, depending on the programmed loading operation. Prior art die sorter 3 as disclosed in FIG. 2 is useful for delivering a first tray 1 and a second tray 1a.

Being L-shaped, said push unit 36 includes a pivot 361 and a push rod 362, wherein said pivot 361 is located on one side of the conveyor 34 and said push rod 362 is situated above the conveyor 34 and at an angle with respect to the horizontal position. Knowing that the conveyor 34 can only deliver the first tray 1 and the second tray 1a to the ballpark sorter position 343, pivot 361 will cause the push rod 362 to turn to a horizontal position and drive push rod 362 so as to push the second tray 1a, located behind the first tray 1, and the first tray 1 to the ballpark sorter position 343, simultaneously.

Said robot arm 38 is capable of loading dies by picking up die 2 from die tray 32 and placing it onto slot 16 until all slots of the first tray 1 and the second tray 1a are filled with dies 2.

Being a plastic material, the first tray 1's lower sidewall 12 often includes mold lines with rough surface. Being the outer rim of tray 1, the lower sidewall 12 is prone to deformation caused by collision or heat. Using the lower sidewall 12, which lacks the smooth surface, for positioning, the prior art tray 1 is incapable of being positioned accurately at the exact sorter position 343, hence preventing the robot arm from loading individual dies precisely and causing production losses.

SUMMARY OF THE INVENTION

Aimed at resolving the above disadvantage, the main object of the present invention is to provide a tray-positioning device capable of utilizing the smoother upper sidewall, which has no mold lines or deformations commonly found on the lower sidewalls of a tray, for precision positioning.

The following Description and Designation of Drawings are provided in order to help understand the features and content of the present invention.

BRIEF DESCRIPTION OF DRAWINGS

The accompanying drawings form a material part of this description, in which.

DETAILED DESCRIPTION OF THE PREFERRED EMBODIMENT

In the following description, the present invention is described in connection with a specific and preferred embodiment. It will be understood that the present invention is not limited to these embodiments, but rather is to be construed as the spirit and scope defined by the appended claims.

Figure 1:
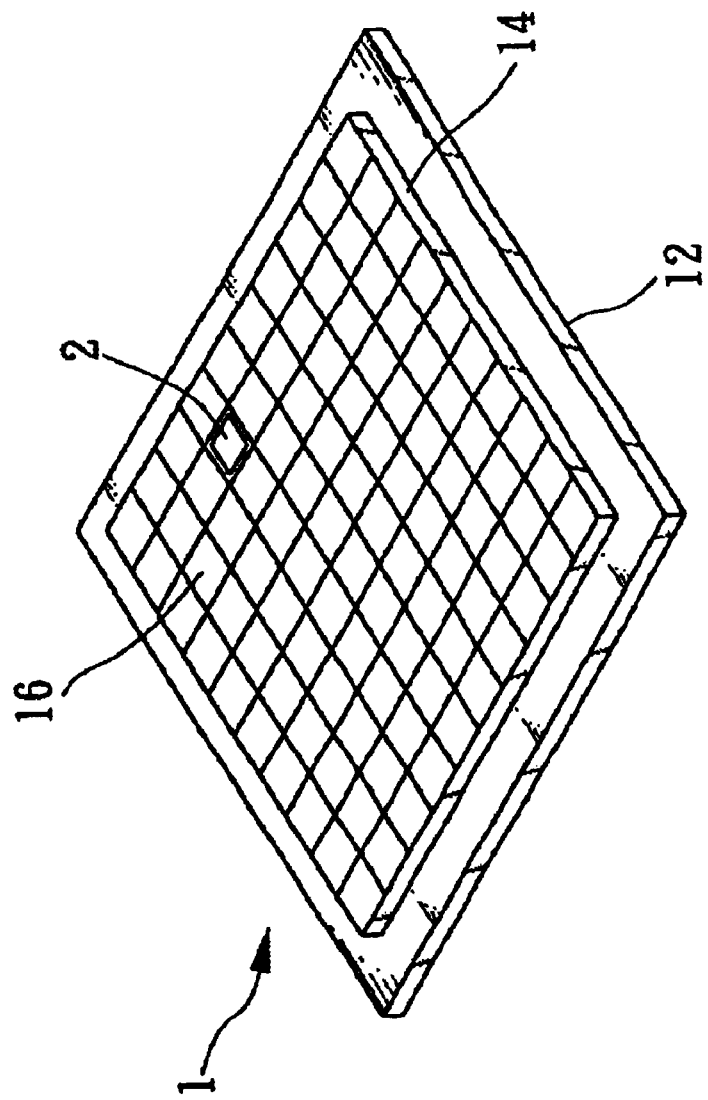
FIG. 1 is a perspective view of a tray 1.
Figure 2:
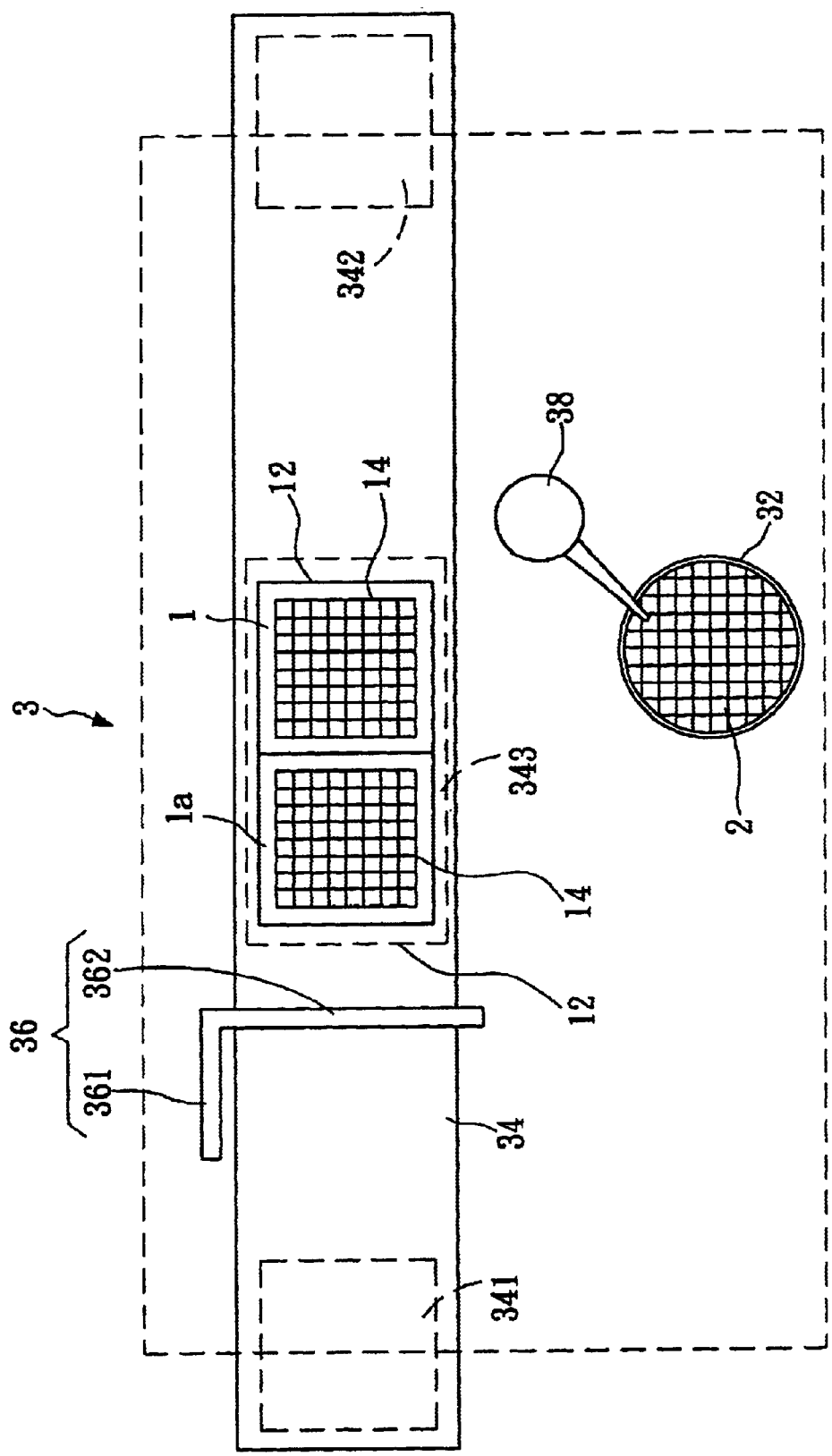
FIG. 2 is a top view of a die sorter 3.
Figure 3A:
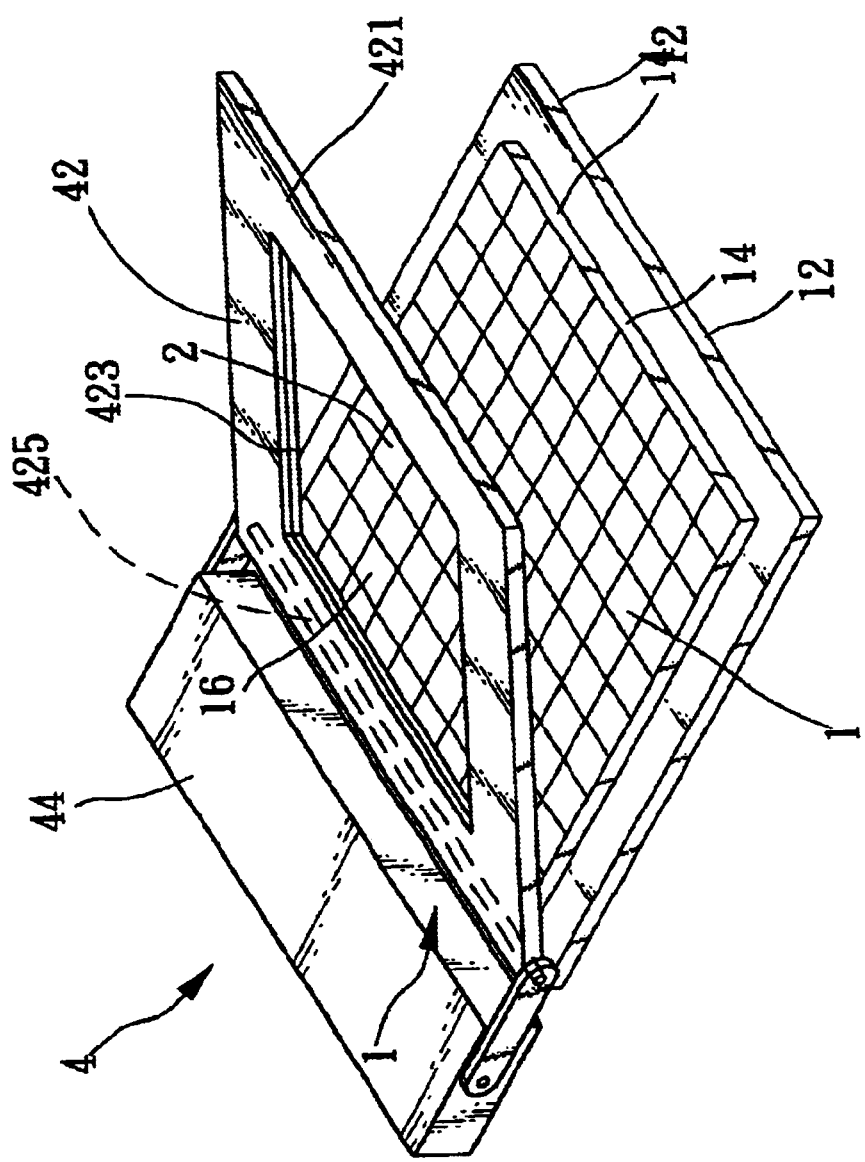
FIGS. 3A and 3B are perspective views of a tray-positioning device 4 in accordance with the first preferred embodiment of the present invention.
Figure 3B:
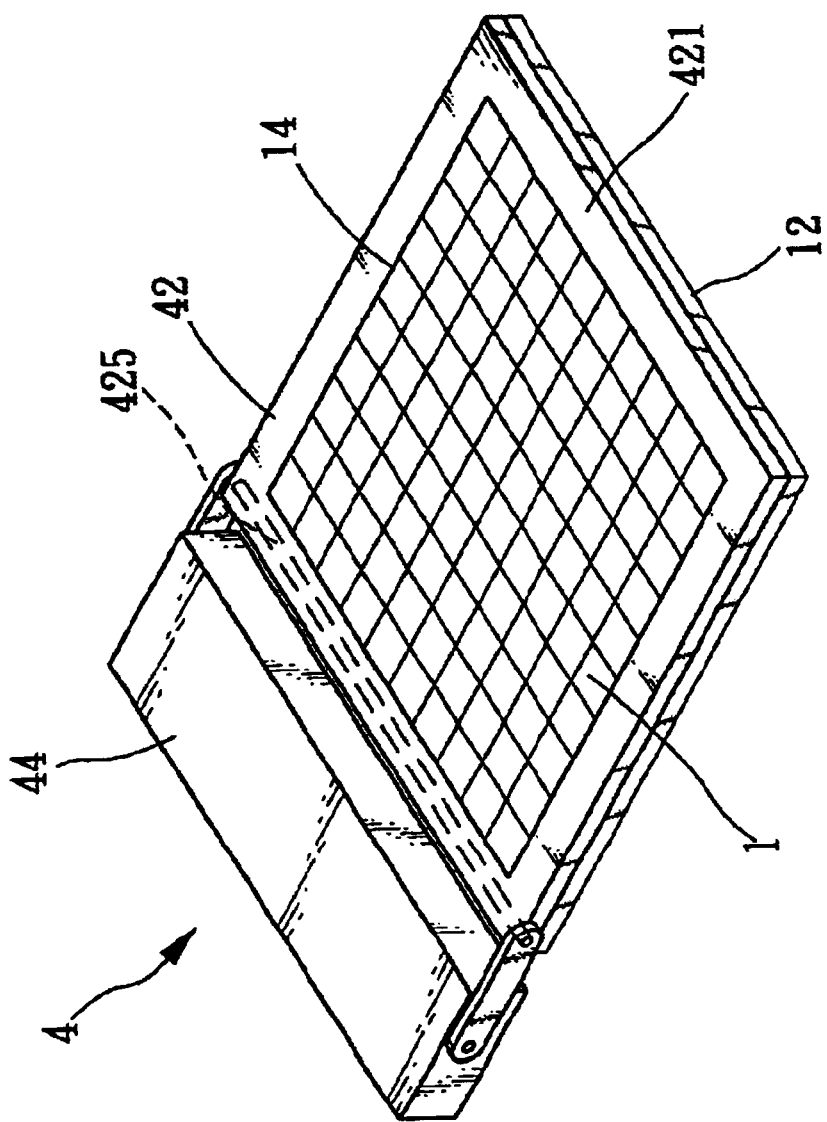

Please refer to FIGS. 3A and 3B, which illustrate a tray-positioning device 4 in accordance with the first preferred embodiment of the present invention. Said tray-positioning device 4 comprises a positioning unit 42 and a driving unit 44. Said positioning unit 42 has four sidewalls 421, which provide four guiding corners 423 on the inner side. Said guiding corner 423 and the upper sidewalls 14 are capable of fitting closely with each other. Said sidewall 421 has a pivot 425 and said driving unit 44 is connected to the pivot 425.

Prior to the positioning process, the positioning unit 42 is set at a proper angle above the horizontal position with tray 1 located in the general area below it. When the driving unit 44 drives the positioning unit 42 and causes it to rotate around the pivot 425 towards the tray 1. When the positioning unit 42 nears the horizontal position, the position of tray 1 is so adjusted that its upper sidewalls 14 are confined by the sidewalls 421 within the guiding corners 423, thus accomplishing the positioning of tray 1 as shown in FIG. 3B.

Figure 4A:
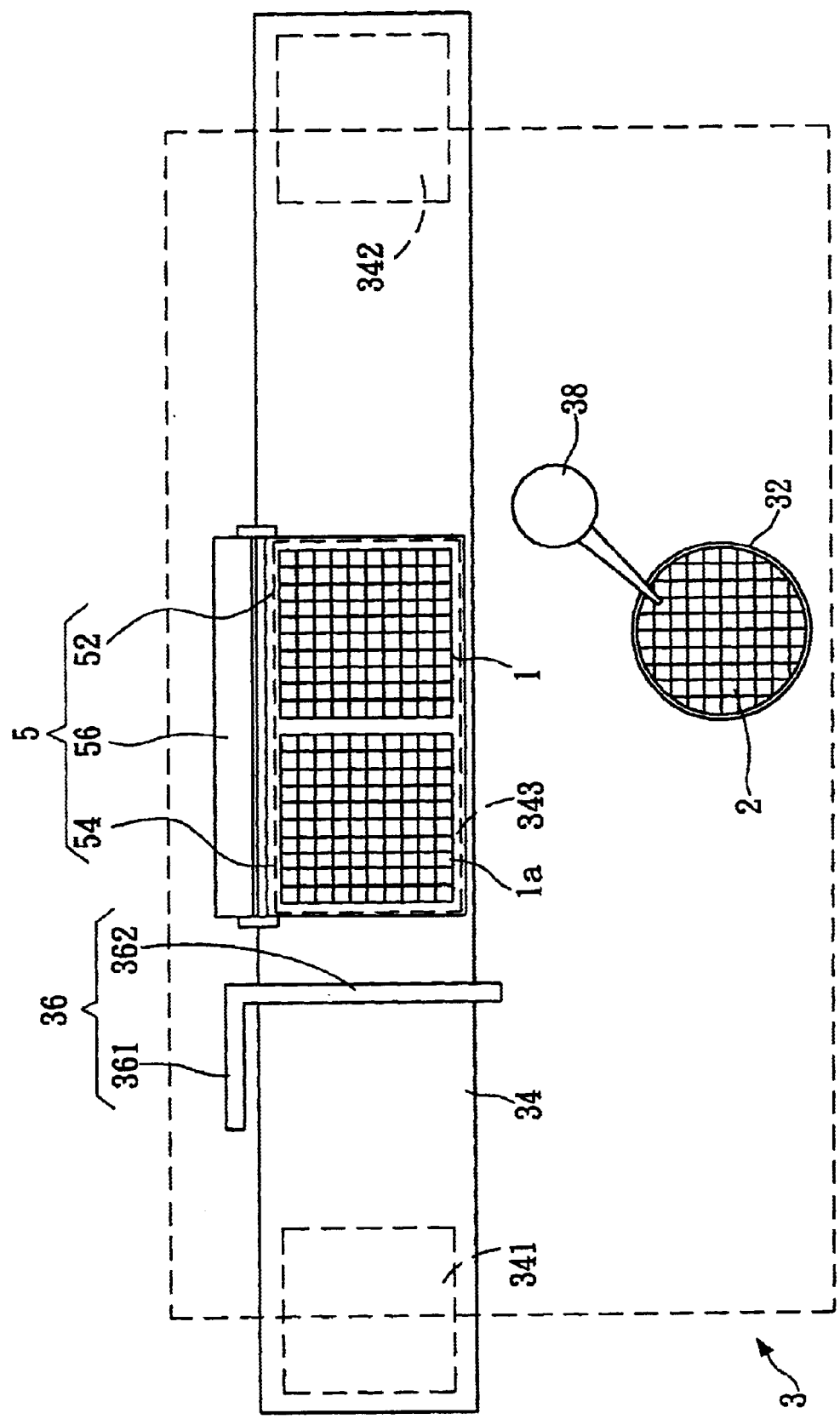
FIGS. 4A, 4B and 4C are views showing a tray-positioning device 5 in accordance with the second preferred embodiment of the present invention.
Figure 4B:
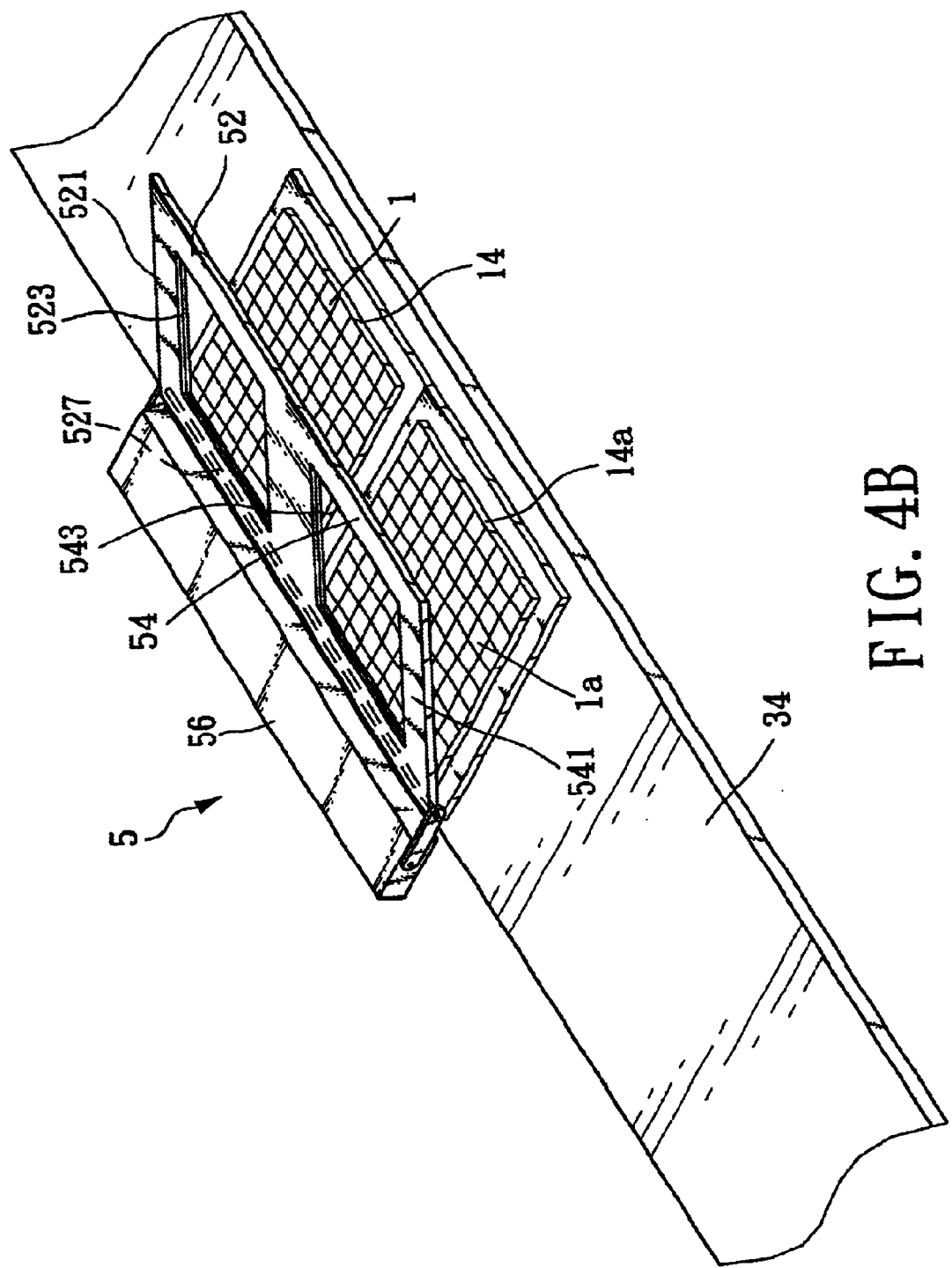
Figure 4C:
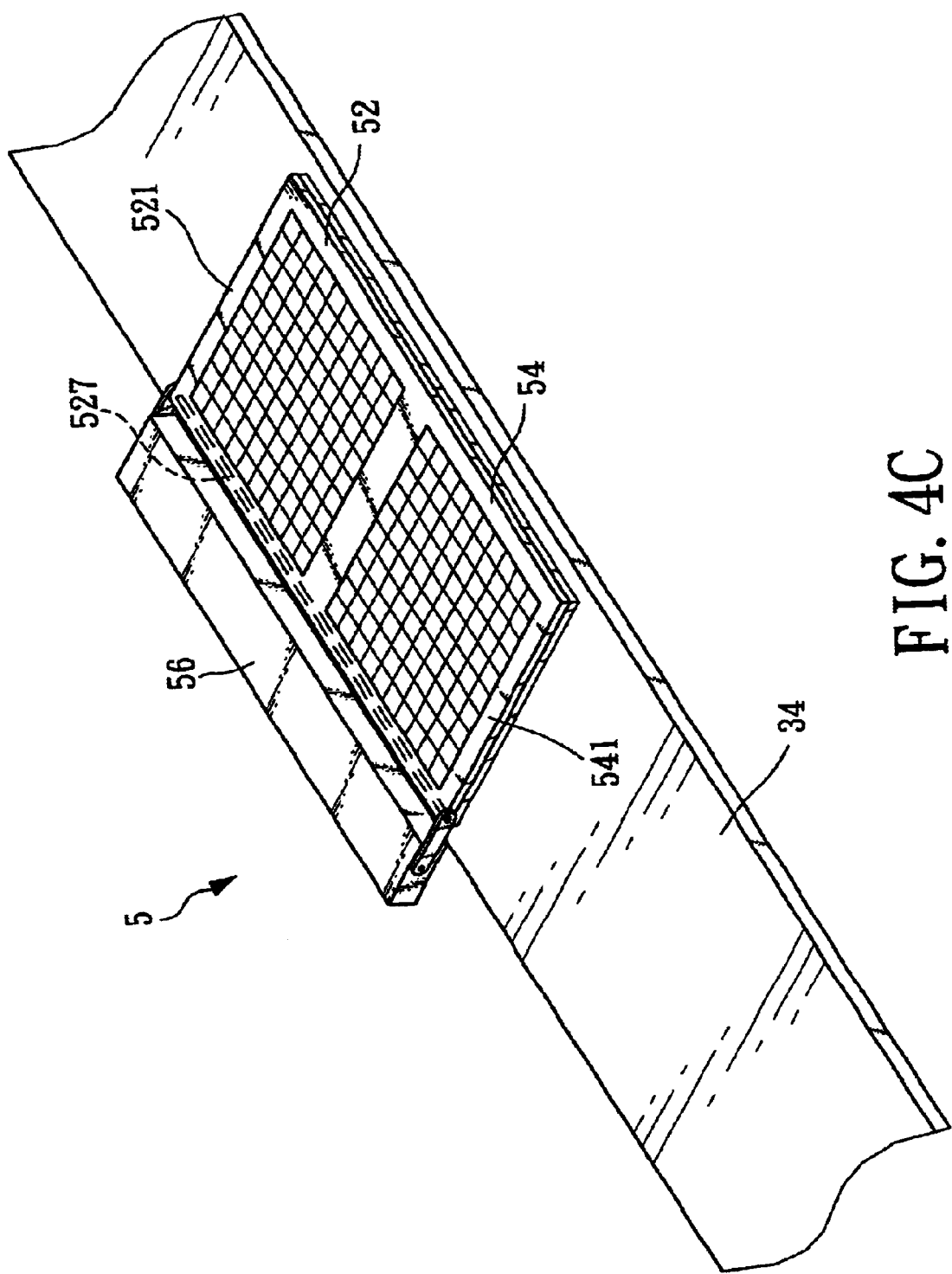

Please refer to FIGS. 4A, 4B and 4C, which illustrate a tray-positioning device 5 in accordance with the second preferred embodiment of the present invention. Capable of simultaneous positioning a first tray 1 and a second tray 1a, said tray-positioning device 5 comprises a first positioning unit 52, a second positioning unit 54 and a driving unit 56. The first positioning unit 52 has four first sidewalls 521, which provide four guiding corners 523 on the inner side. The guiding corner 523 and the upper sidewalls 14 are capable of fitting closely with each other. The second positioning unit 54 has four second sidewalls 541, one of which being connected to one of the four first sidewalls 521. The second sidewalls 541 provide four guiding corners 543 on the inner side. Said guiding corner 543 and the upper sidewalls 14a are capable of fitting closely with each other. Provided by the first positioning unit 52 and the second positioning unit 54, a pivot 527 allows the first positioning unit 52 and the second positioning unit 54 to rotate around it.

The tray-positioning device 5 in accordance with the second preferred embodiment of the present invention is positioned in a ballpark sorter position 343 on a conveyor 34. Prior to the positioning process, the positioning unit 52 is set at a proper angle above the horizontal position. In one delivery, the die sorter 3 is capable of transferring a first tray 1 and a second tray 1a. After being adjusted by the push unit 36, the first tray 1 and the second tray 1 a are located in the general area below the first positioning unit 52 and the second positioning unit 54, respectively. When the first positioning unit 52 and the second positioning unit 54, driven by the driving unit 56, rotate to the horizontal position, the position of first tray 1 and second tray 1a are so adjusted that the upper sidewalls 14 and the upper sidewalls 14a are confined by the first sidewalls 521 and the second sidewalls 541 within the first guiding corners 523 and the second guiding corners 543, respectively, thus accomplishing the positioning of the first tray 1 and the second tray 1a as shown in FIG. 4C.

Figure 5:
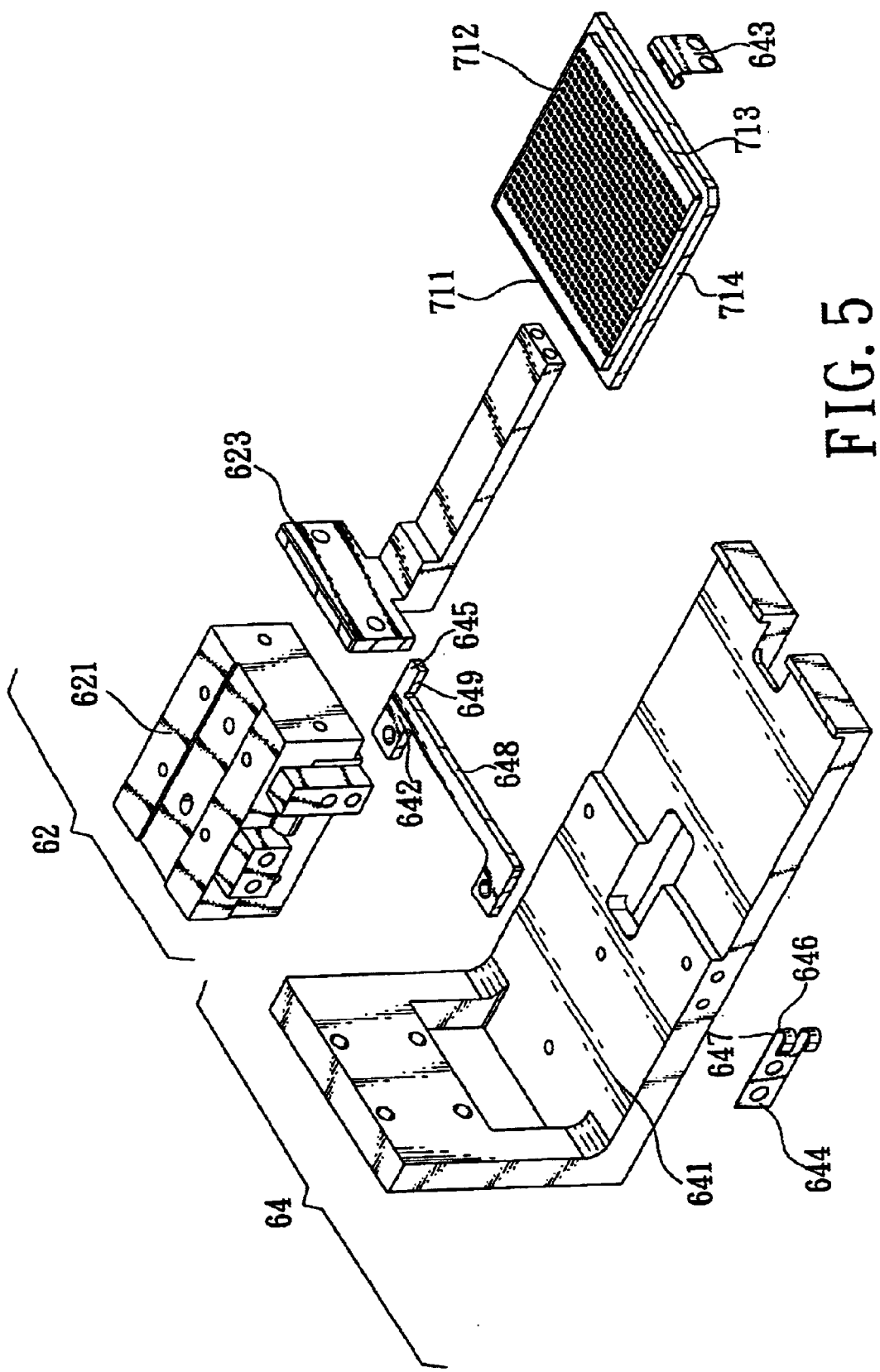
FIG. 5 is an exploded view of a tray-positioning device 6 in accordance with the third preferred embodiment of the present invention.
Figure 6:
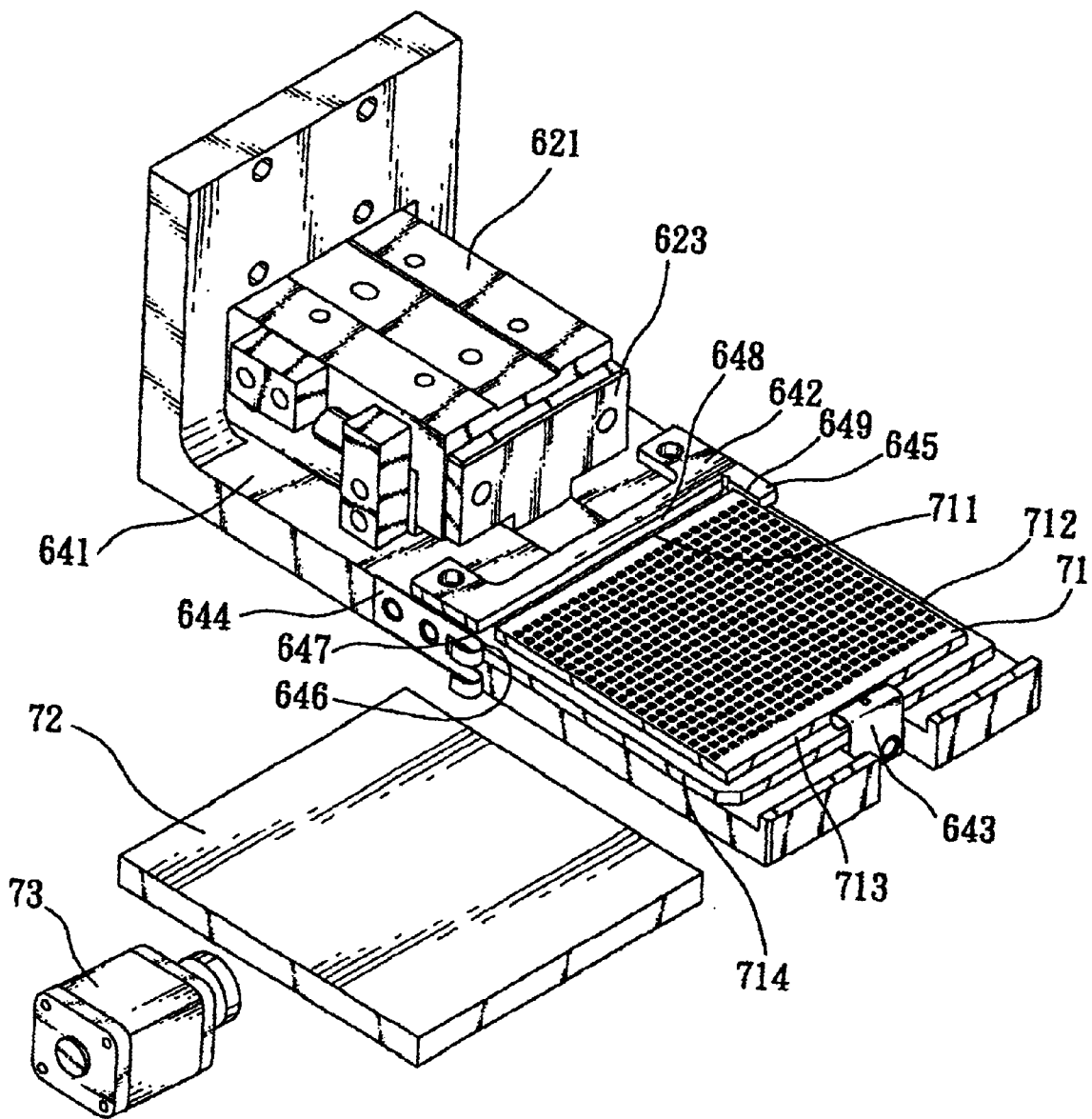
FIG. 6 is an operational view of a tray-positioning device 6 in accordance with the third preferred embodiment of the present invention.
Figure 7:
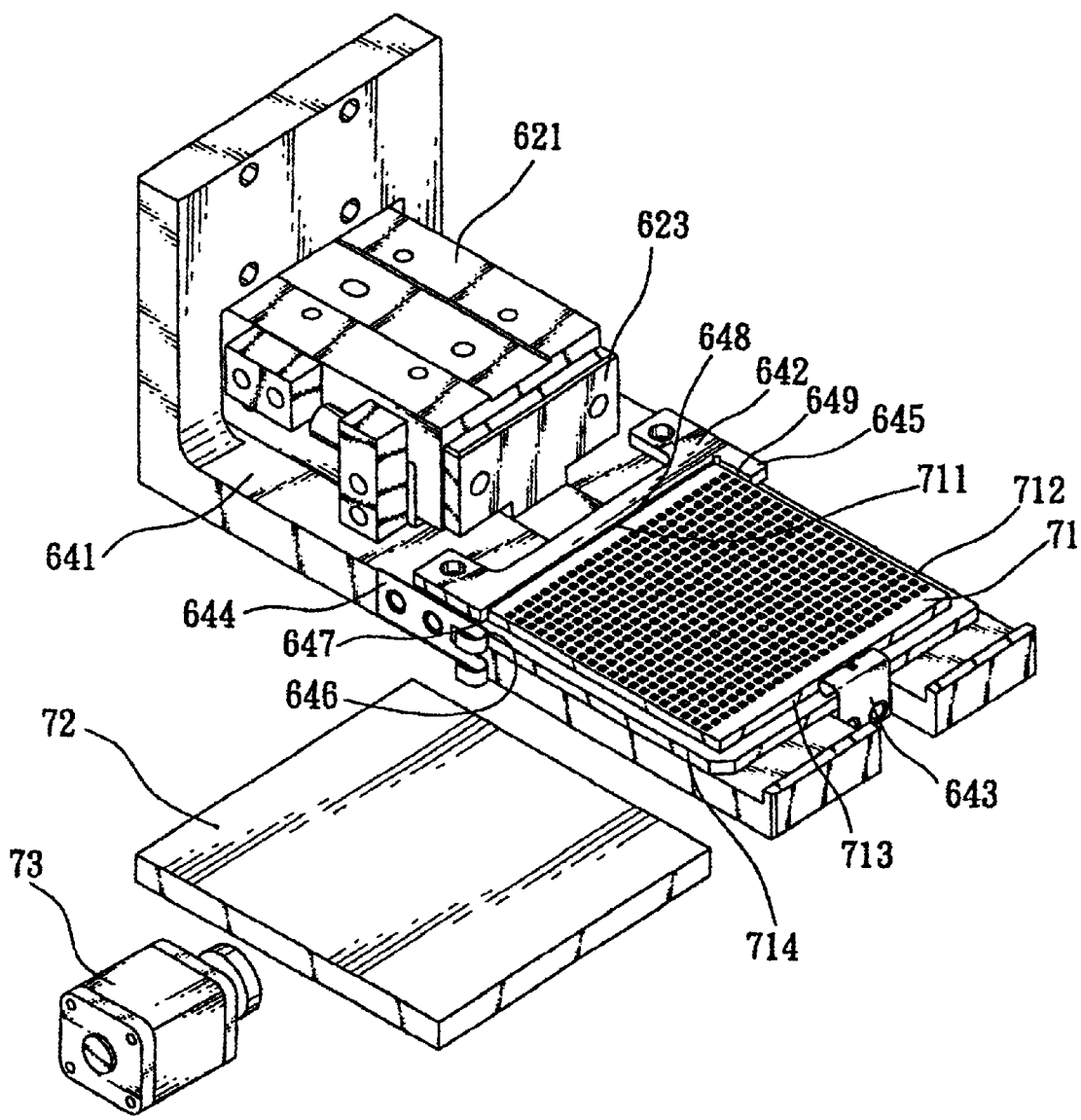
FIG. 7 is a prospective view of a positioned tray-positioning device 6 in accordance with the third preferred embodiment of the present invention.

Please refer to FIGS. 5, 6 and 7, which illustrate an exploded view, an operational view and a perspective view of a tray-positioning device 6, respectively, in accordance with the third preferred embodiment of the present invention. Said tray-positioning device 6 comprises a first driving unit 62 and a positioning unit 64. The first driving unit 62 includes a cylinder 621 and a tray push-pull rod 623, being secured to the cylinder 621. The positioning unit 64 has a positioning base 641, a positioning block 642, a first positioning spring 643 and a second positioning spring 644 wherein said positioning block 642 further comprises an extruded edge stopper 645. The extruded edge stopper 645 and the second positioning spring 644 are provided in proper locations on the positioning base 641. The first positioning spring 643 is secured to the tray push-pull rod 623. A third sidewall 646 and a fourth sidewall 647 are provided on the right hand side of the second positioning spring 644 where it is turns and it is about to turn straight, respectively. A first sidewall 648 is provided on the positioning block 642 where it faces a tray 71. A second sidewall 649 is provided on the inner side of the extruded edge stopper 645. The first sidewall 648 and the second sidewall 649 are perpendicular to each other.

Please refer to FIGS. 6 and 7, which illustrate an operational view and a perspective view of a tray-positioning device 6, respectively, in accordance with the third preferred embodiment of the present invention. A tray 71 provides a first upper sidewall 711, a second upper sidewall 712, a third upper sidewall 713, and a first lower sidewall 714 wherein the first upper sidewall 711 and the second upper sidewall 712 are in parallel with the third upper sidewall 713 and the first lower sidewall 714, respectively, and the first upper sidewall 711 is in perpendicular to the second upper sidewall 712. Driven by a second driving unit 73, the tray 71 located at 72-input output location is moved to the general area on the positioning base 64 as shown in FIG. 7. The first positioning spring 643 is situated behind the tray 71 and the tray 71 is located between the positioning block 642 and the first positioning spring 643. Meanwhile, the first upper sidewall 711 is situated between the third sidewall 646 of second positioning spring 644 and the second sidewall 649 of the extruded edge stopper 645. Responding to a positioning instruction, the cylinder 621 drives the tray push-pull rod 623 to pull the first positioning spring 643 such that the first positioning spring 643 hooks on the tray 71 and cause it to move toward the positioning block 642. As it nears the first sidewall 648 of the positioning block 642, the first upper sidewall 711 of the tray 71 has just passed entrance between the third sidewall 646 of the second positioning spring 644 and the second sidewall 649 of the extruded edge stopper 645 and is about to enter an area bonded by the fourth sidewall 647 of second positioning spring 644 and the second sidewall 649 of the extruded edge stopper 645 for containing the tray 71. When the tray 71 further approaches, the pulling force by the first positioning spring 643 causes the first upper sidewall 711 of the tray 71 to be in close contact with the first sidewall 648 of the positioning block 642. By bringing the first upper sidewall 711 and the second upper sidewall 712 of the tray 71 to be in close contact with the first sidewall 648 and the second sidewall 649, respectively, the present invention establishes the first upper sidewall 711 and a second upper sidewall 712 as the bases for precision positioning of the tray 71 in FIG. 8.

It is apparent that, by utilizing tray positioning devices 4, 5 or 6, the tray 3 is capable of achieving elevated precision for positioning, improving the successful loading rate by the robot arm 38 and lowering the production cost.

While the invention has been described in terms of a preferred embodiment, various alternatives and modifications can be devised by those skilled in the art without departing from the invention. Accordingly, the present invention is intended to embrace all such alternatives that fall within the scope of the claims.

What is claimed is:

1. A small tray-positioning device, comprising:
 a) a base;
 b) a driving unit secured to the base; and
 c) a positioning unit including:
  i) a first positioning spring connected to the driving unit;
  ii) a second positioning spring being secured to one side of the base; and
  iii) a positioning block secured to the base and having first and second guiding sidewalls adjacent to each other and immovable relative to each other such that the first and second guiding sidewalls are adapted to contact a first upper sidewall and a second upper sidewall of a tray placed on the positioning device, respectively wherein said first guiding sidewall is perpendicular to said second guiding sidewall.

2. The tray-positioning device of claim 1 wherein said first positioning spring and said second positioning spring, point towards an intersection of the first guiding sidewall and the second guiding sidewall, and said first positioning spring drives said tray from a farthest diagonal across the intersection.

3. A small tray-positioning device, comprising:
- a) a base;
- b) a driving unit secured to the base; and
- c) a positioning unit including:
  - i) a first positioning spring connected to the driving unit;
  - ii) a second positioning spring being secured to one side of the base; and
  - iii) a positioning block secured to the base and having first and second guiding sidewalls adjacent to each other and immovable relative to each other such that the first and second guiding sidewalls are adapted to contact a first upper sidewall and a second upper sidewall of a tray placed on the positioning device, respectively;

wherein said first positioning spring and said second positioning spring, point towards an intersection of the first guiding sidewall and the second guiding sidewall, and said first positioning spring drives said tray from a farthest diagonal across the intersection.

\* \* \* \* \*